(12) United States Patent
Hung et al.

(10) Patent No.: US 12,354,927 B2
(45) Date of Patent: Jul. 8, 2025

(54) SEMICONDUCTOR DEVICE

(71) Applicant: Taiwan Semiconductor Manufacturing Company, Ltd., Hsinchu (TW)

(72) Inventors: Wensen Hung, Hsinchu County (TW); Yih-Ting Shen, Changhua County (TW); Jia-Syuan Li, Taoyuan (TW); Tsung-Yu Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 657 days.

(21) Appl. No.: 17/700,498

(22) Filed: Mar. 22, 2022

(65) Prior Publication Data

US 2023/0071542 A1 Mar. 9, 2023

Related U.S. Application Data

(60) Provisional application No. 63/242,049, filed on Sep. 9, 2021.

(51) Int. Cl.
| | |
|---|---|
| *H01L 23/367* | (2006.01) |
| *H01L 23/00* | (2006.01) |
| *H01L 23/498* | (2006.01) |
| *H01L 25/065* | (2023.01) |

(52) U.S. Cl.
CPC .... *H01L 23/3675* (2013.01); *H01L 23/49833* (2013.01); *H01L 24/16* (2013.01); *H01L 24/32* (2013.01); *H01L 24/73* (2013.01); *H01L 25/0655* (2013.01); *H01L 23/49816* (2013.01); *H01L 2224/16225* (2013.01); *H01L 2224/32225* (2013.01); *H01L 2224/73204* (2013.01); *H01L 2924/1611* (2013.01); *H01L 2924/1616* (2013.01); *H01L 2924/16235* (2013.01); *H01L 2924/16251* (2013.01); *H01L 2924/1632* (2013.01); *H01L 2924/182* (2013.01);

(Continued)

(58) Field of Classification Search
CPC ...... H01L 23/3675; H01L 24/16; H01L 24/32
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Errol V Fernandes
(74) *Attorney, Agent, or Firm* — JCIPRNET

(57) ABSTRACT

A semiconductor device including a package, a lid and a thermal interface material is provided. The package includes a packaging substrate, semiconductor dies and an insulating encapsulation, wherein the semiconductor dies are disposed on and electrically connected to the packaging substrate, and the insulating encapsulation encapsulates the semiconductor dies. The lid is disposed on the packaging substrate, the lid includes a cover portion and foot portion extending from the cover portion to the packaging substrate, wherein the cover portion covers the semiconductor dies and the insulating encapsulation, the foot portion includes foot segments laterally spaced apart from one another, and the foot segments are attached to the packaging substrate. The cover portion of the lid is attached to the package through the thermal interface material.

20 Claims, 11 Drawing Sheets

(52) U.S. Cl.
CPC ............... *H01L 2924/3511* (2013.01); *H01L 2924/35121* (2013.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2004/0118500 A1* | 6/2004 | Wang ............... H01L 21/4882 156/60 |
| 2019/0122999 A1* | 4/2019 | Hung ............... H01L 23/053 |

\* cited by examiner

SEMICONDUCTOR DEVICE

CROSS-REFERENCE TO RELATED APPLICATION

This application claims the priority benefit of U.S. provisional application Ser. No. 63/242,049, filed on Sep. 9, 2021. The entirety of the above-mentioned patent application is hereby incorporated by reference herein and made a part of this specification.

BACKGROUND

In packaging of semiconductor devices, after individual semiconductor dies are manufactured and packaged, the packaged semiconductor devices may be mounted on a packaging substrate with other electronic components, such as other semiconductor dies, to form a semiconductor device. The semiconductor device having semiconductor dies mounted thereon are then bonded to a printed circuit board through a thermal process. Warpage and stress may occur during the thermal process due to the mismatch in Coefficient of Thermal Expansion (CTE) between different materials and different package components, such as different material between the packaging substrate and the semiconductor dies. The warpage may lead to shorting between connectors of the package packaging substrate and/or open circuit between the connectors and the printed circuit board. It is desired to reduce the warpage of the semiconductor device when bonding to a printed circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
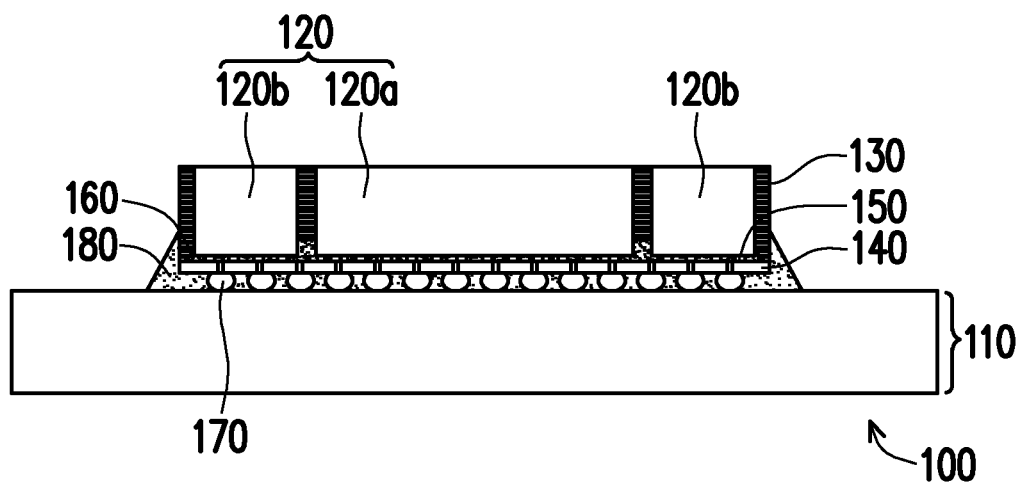
FIG. 1 through FIG. 4 are cross-sectional views schematically illustrating a process flow for fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g., a composition which is "substantially free" from Y may be completely free from Y.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

In semiconductor industry, various chip packages or electronic components may be mounted on a packaging circuit substrate to form a semiconductor device. The semiconductor device may then be bonded to a printed circuit board (PCB) through a thermal process. Usually, the chip packages and the circuit substrate are formed of different materials having mismatched coefficient of thermal expansion (CTE).

As a result, the chip packages and circuit substrate experience significantly different dimensional change under temperature change. If uncompensated, the disparity in CTE can result in warpage of the semiconductor device be it under room temperature or during the thermal process while bonding to a PCB. The effect of mismatch in the CTE is more pronounced with increase in dimension of the chip package, therefore the degree of warpage may be different along different direction. For example, the semiconductor device may be warped to a greater degree along the length direction of the chip package than along the width direction of the chip package. Depending on the mismatch of CTE, the warped semiconductor device may be concave (i.e., the middle portion of the warped semiconductor device is lower than the edge portion of the warped semiconductor device) or convex (i.e., the middle portion of the warped semiconductor device is higher than the edge portion of the warped semiconductor device).

FIG. 1 through FIG. 4 are cross-sectional views schematically illustrating a process flow for fabricating a semiconductor device in accordance with some embodiments of the present disclosure.

Referring to FIG. 1, a package 100 including a packaging substrate 110, semiconductor dies 120 and an insulating encapsulation 130 is provided. The semiconductor dies 120 are disposed on and electrically connected to the packaging substrate 110, and the insulating encapsulation 130 laterally encapsulates the semiconductor dies 120. In some embodiments, as illustrated in FIG. 1, a Chip-on-Wafer-on-Substrate (CoWoS) package 100 is provided. The CoWoS package 100 may include a packaging substrate 110, semiconductor dies 120, an insulating encapsulation 130, an interposer 140, conductive terminals 150, an underfill 160, conductive terminals 170 and an underfill 180.

The packaging substrate 110 may be a printed circuit board. The semiconductor dies 120 may include at least one semiconductor die 120a and at least one semiconductor die 120b. In some embodiments, the semiconductor die 120a includes a System-on-Chip (SoC) die, and the semiconductor die 120b includes a High-Bandwidth-Memory (HBM) cube including stacked HBM memory dies and controller die for controlling operation of the stacked HBM memory dies. In some other embodiments, the semiconductor die 120a and 120b may be System on Integrated Circuit (SoIC) dies with various functions. The semiconductor dies 120 are disposed on the interposer 140 and electrically connected to the interposer 140 through the conductive terminals 150. The semiconductor dies 120 are bonded with the interposer 140 through the conductive terminals 150 by a Chip-on-Wafer (CoW) bonding process. The conductive terminals 150 are disposed between the semiconductor dies 120 and the interposer 140. The conductive terminals 150 may be or include micro-bumps for electrically connecting the semiconductor dies 120 and the interposer 140. The underfill 160 is disposed on the interposer 140. The underfill 610 fills the gap between the semiconductor dies 120 and the interposer 140 to laterally encapsulate the conductive terminals 150. The material of the underfill 160 may be or include epoxy resin or other suitable dielectric materials.

The insulating encapsulation 130 is disposed on the interposer 140 to laterally encapsulate the semiconductor dies 120 and the underfill 160. The insulating encapsulation 130 is not in contact with the foot portion 124 of the lid 210. As illustrated in FIG. 1, the top surfaces (e.g., the back surfaces) of the semiconductor dies 120 are substantially level with the top surface of the insulating encapsulation 130, and the sidewalls of the insulating encapsulation 130 are substantially aligned with the sidewalls of the interposer 140. The conductive terminals 170 are disposed on the bottom surface of the interposer 140, and the interposer 140 is electrically connected to the packaging substrate 110 through the conductive terminals 170. The conductive terminals 170 may be or include Controlled Collapse Chip Connection bumps (C4 bumps) for electrically connecting the interposer 140 and the packaging substrate 110. The underfill 180 is disposed on the packaging substrate 110. The underfill 180 fills the gap between the interposer 140 and the packaging substrate 110 to laterally encapsulate the conductive terminals 170. Furthermore, the underfill 180 covers sidewalls of the interposer 140 as well as lower portions of sidewalls of insulating encapsulation 130.

As illustrated in FIG. 1, the semiconductor dies 120 are electrically connected to the packaging substrate 110 through the interposer 140, the conductive terminals 150 and the conductive terminals 170. The interposer 140 may be a silicon interposer with fine line pitch (e.g., sub-um pitch), an organic interposer with less aggressive fine line pitch (e.g., 4 um pitch) or an interposer with Local Silicon Interconnect (LSI) die. In an embodiment where the interposer 140 is a silicon interposer, the CoWoS package 100 is so-called a CoWoS-S package. In an embodiment where the interposer 140 is an organic interposer, the CoWoS package 100 is so-called a CoWoS-R package. In an embodiment where the interposer 140 is an interposer with Local Silicon Interconnect (LSI) die, the CoWoS package 100 is so-called a CoWoS-L package.

Although an CoWoS package 100 is shown in FIG. 1 for illustration, the configuration of the package 100 is not limited to CoWoS package, an integrated fanout assembly-on-Substrate (InFO-oS) package may be utilized in embodiments of the present invention.

Figure 2:
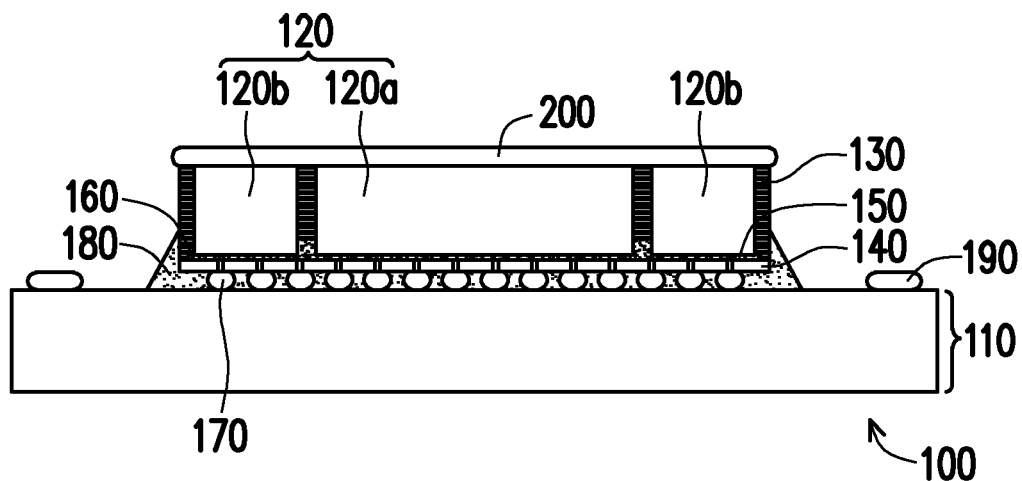

Referring to FIG. 2, an adhesive 190 is applied on the packaging substrate 110, and a thermal interface material (TIM) 200 is applied on the top surfaces (e.g., the back surfaces) of the semiconductor dies 120 and the top surface of the insulating encapsulation 130. The material of the adhesive 190 may be or include thermally conductive adhesive, silicone based adhesive or epoxy resin based adhesive. The material of the adhesive may be or include rubber based having curing promoting material. The thermal interface material 200 may be or include silicone-based thermal interface material, metallic thermal interface material, combinations thereof or the like. In the present embodiments, a film-type thermal interface material 200 is provided and attached on the top surfaces (e.g., the back surfaces) of the semiconductor dies 120 and the top surface of the insulating encapsulation 130.

Figure 3:
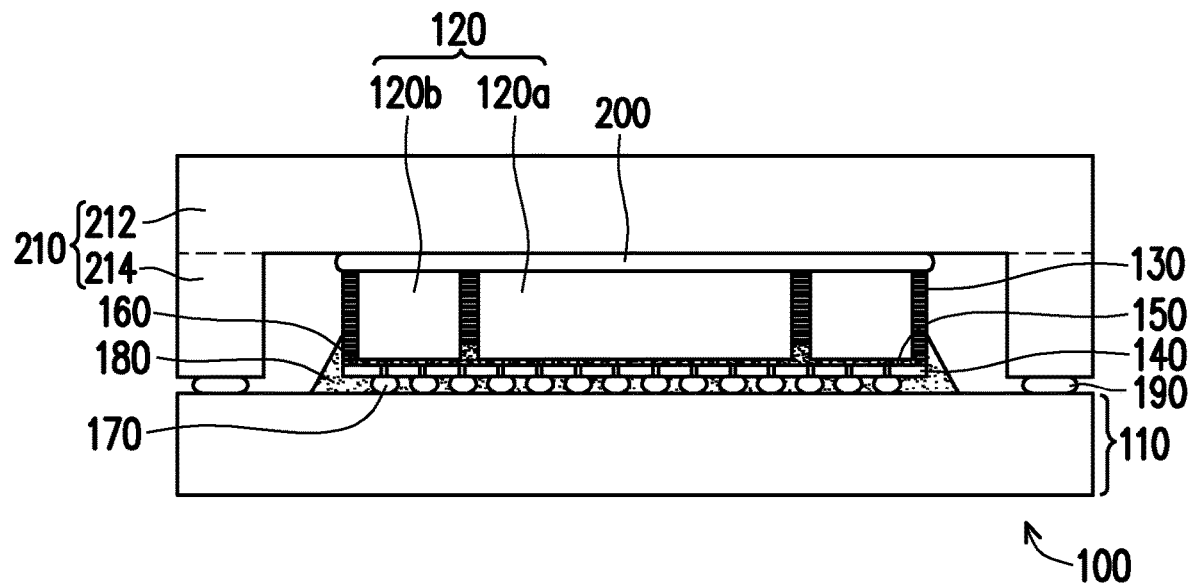

Referring to FIG. 3, after the adhesive 190 and the thermal interface material 200 are applied, a lid 210 is provided and attached onto the CoWoS package 100. The lid 210 is mounted onto the packaging substrate 110 to cover the semiconductor dies 120 encapsulated by the insulating encapsulation 130. The lid 210 includes a cover portion 212 and a foot portion 214 extending from the cover portion 212 to the packaging substrate 110. The cover portion 212 covers the semiconductor dies 120 and the insulating encapsulation 130. The bottom surface of the foot portion 214 is attached to the packaging substrate 110 through the adhesive 190, and the cover portion 212 of the lid 210 is attached to the package 100 through the thermal interface material 200. The lid 210 may further include an alignment notch 216 formed at a corner of the lid 10 such that the lid 210 may be assembled with the packaging substrate 110 correctly and rapidly. The details of the lid 210 are described in accompany with FIG. 5 and FIG. 6.

Figure 4:
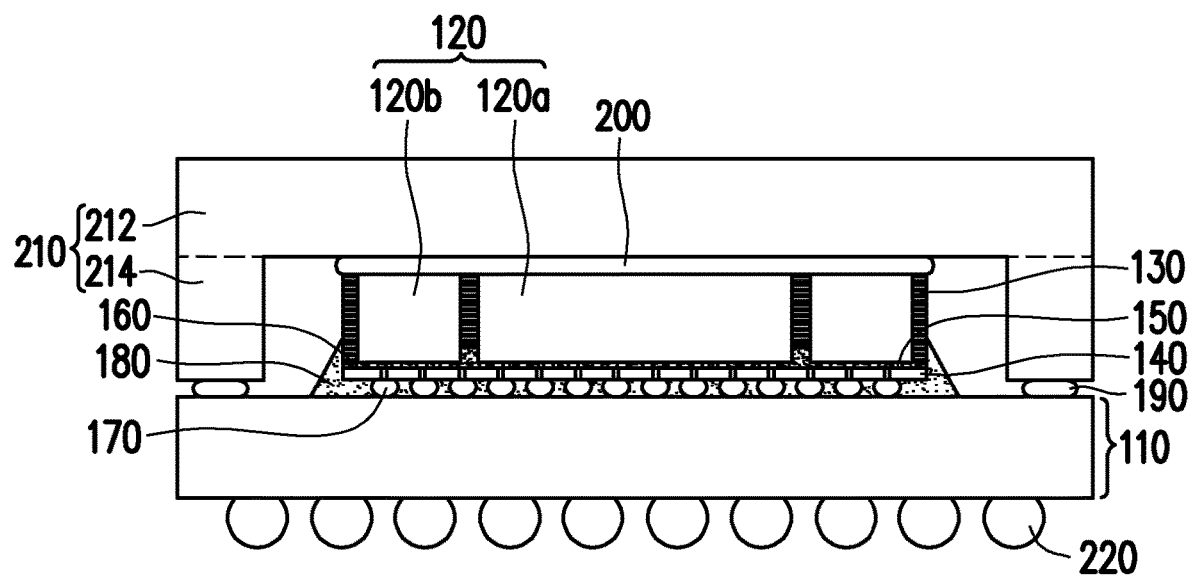

Referring to FIG. 4, conductive terminals 220 are formed on the bottom surface of the packaging substrate 110. The conductive terminals 112 formed on the bottom surface of the packaging substrate 110 may be solder balls arranged in array, and the solder balls may be formed by, for example, a ball mount process following by a reflowing process. The packaging substrate 110 may be a ball grid array (BGA) circuit board. After the conductive terminals 220 are formed on the bottom surface of the packaging substrate 110, a singulation process may be performed to cut the packaging substrate 110 to obtain singulated semiconductor devices as shown in FIG. 4.

Figure 5:
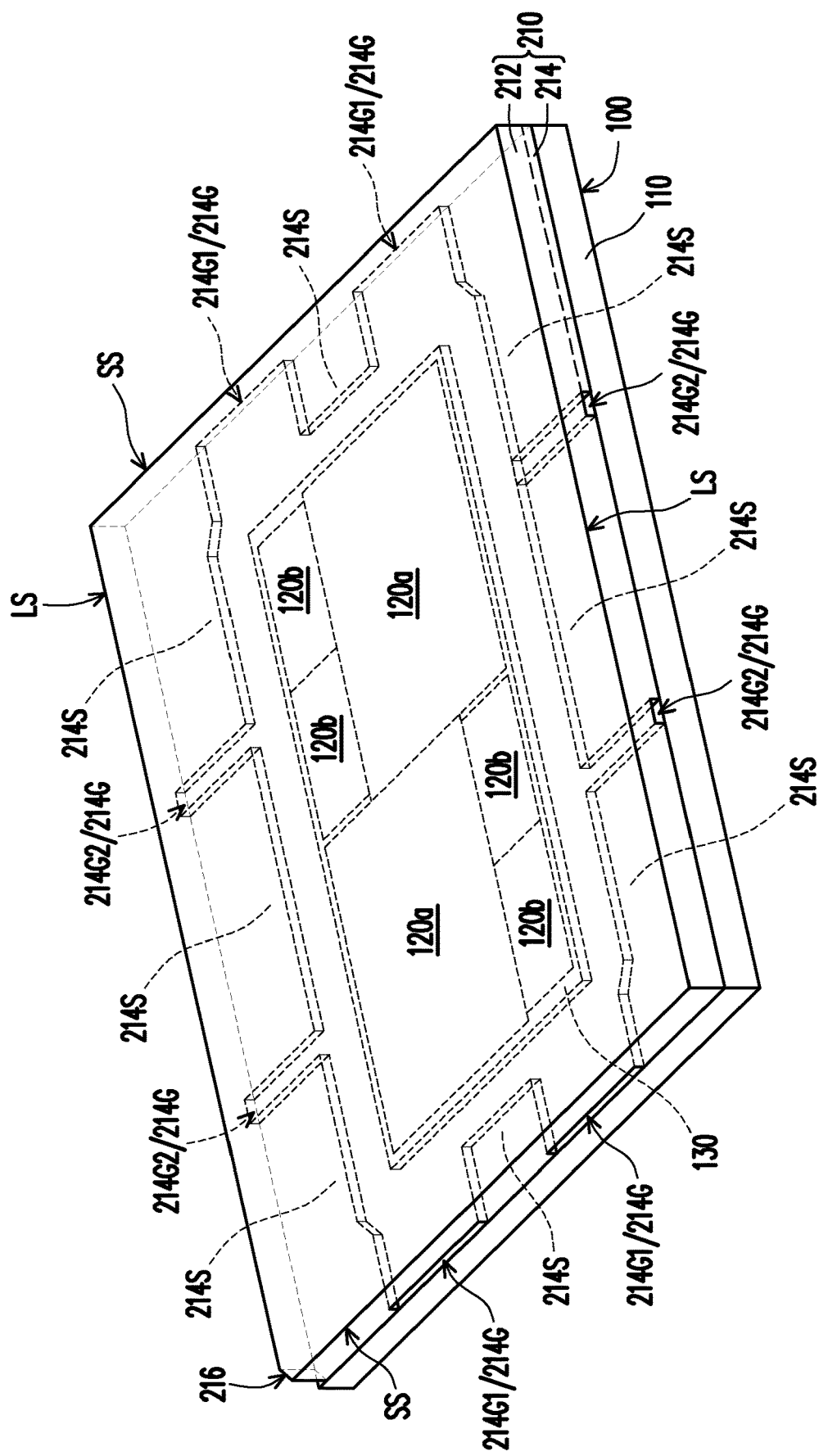
FIG. 5 is a perspective view schematically illustrating a semiconductor device shown in FIG. 3 in accordance with some embodiments of the present disclosure.
Figure 6:
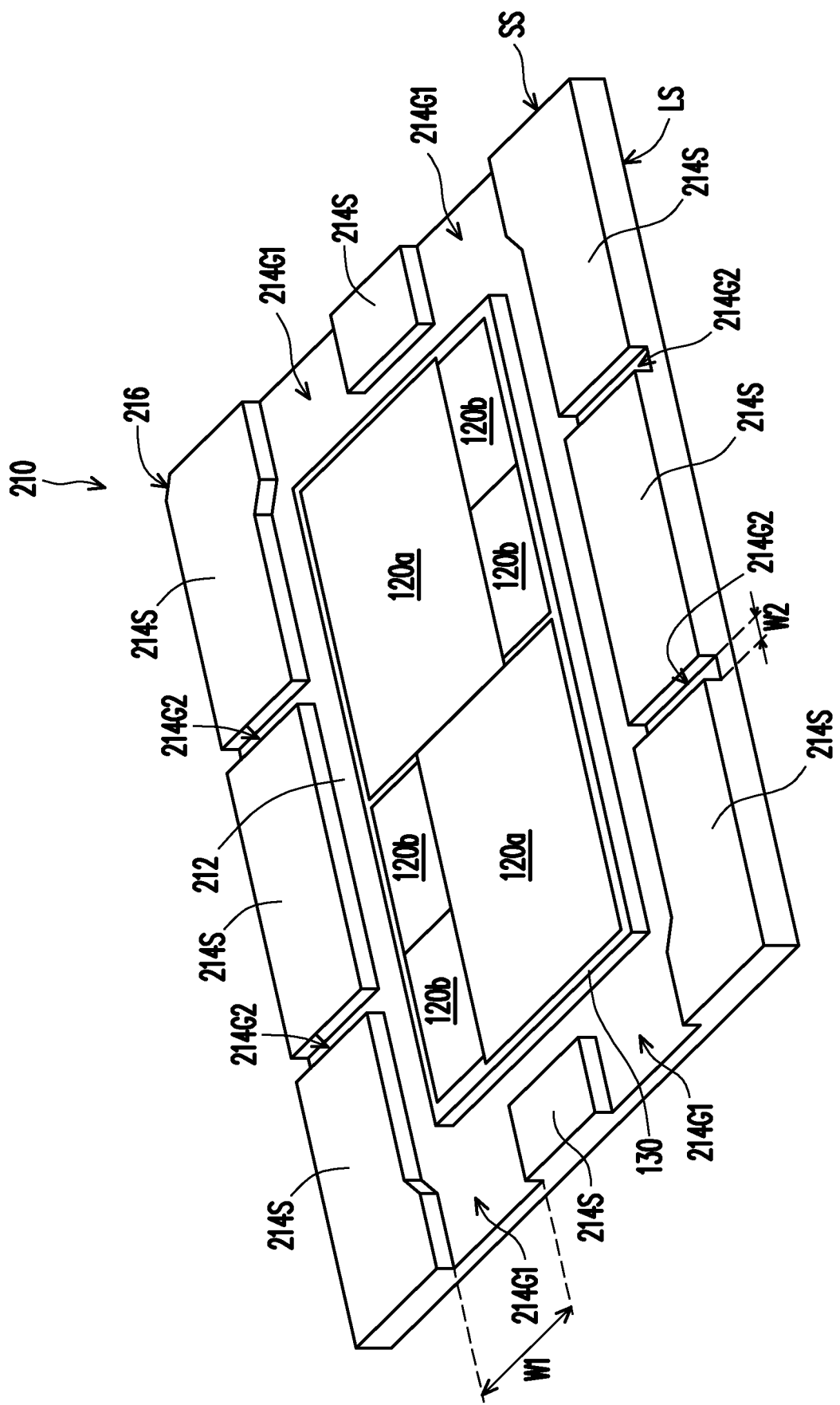
FIG. 6 is a three-dimensional view schematically illustrating the package and the lid shown in FIG. 5 in accordance with some embodiments of the present disclosure.

FIG. 5 is a perspective view schematically illustrating a semiconductor device shown in FIG. 3 in accordance with some embodiments of the present disclosure, and FIG. 6 is a three-dimensional view schematically illustrating the package and the lid shown in FIG. 5 in accordance with some embodiments of the present disclosure.

Referring to FIG. 3, FIG. 5 and FIG. 6, the foot portion 214 of the lid 210 includes foot segments 214S arranged along the periphery of the cover portion 212 of the lid 210. The foot segments 214S are laterally spaced apart from one another, and the bottom surfaces of the foot segments 214S are attached to the packaging substrate 110 through the adhesive 190 (shown in FIG. 3) such that the lid 210 may adhere with the packaging substrate 110 firmly. In some embodiments, the foot portion 214 of the lid 210 includes stiffness adjustment grooves 214G, and the foot segments 214S are laterally spaced apart from one another by the stiffness adjustment grooves 214G. The stiffness adjustment grooves 214G are cut-off portions formed in the foot portion 214 of the lid 210. The stiffness adjustment grooves 214G (i.e., the cut-off portions) may serve as weakened portions, stiffness control portions or warpage control portions which are formed in the foot portion 214 of the lid 210. In some embodiments, stiffness adjustment grooves 214G extend across the foot portion 214 to reduce overall structural strength of the lid 210. When attaching the foot segments 214S to the packaging substrate 110, due to the stiffness adjustment grooves 214G formed in the foot portion 214, the cover portion 212 of the lid 210 may properly deform to substantially match with an overall profile of the back surfaces of the semiconductor dies 120a and 120b as well as the top surface of the insulating encapsulation 130. In some embodiments, an overall profile of the back surfaces of the semiconductor dies 120a and 120b as well as the top surface of the insulating encapsulation 130 is a convex profile due to the warpage of the package 100 (shown in FIG. 3), and the cover portion 212 of the lid 210 attached to the package 100 may warp to substantially match with the above-mentioned convex profile. In some other embodiments, an overall profile of the back surfaces of the semiconductor dies 120a and 120b as well as the top surface of the insulating encapsulation 130 is a concave profile due to the warpage of the package 100 (shown in FIG. 3), and the cover portion 212 of the lid 210 attached to the package 100 may warp to substantially match with the above-mentioned concave profile.

After the lid 210 including the stiffness adjustment grooves 214G is attached onto the package 100 through the adhesive 190 and the thermal interface material 200, the thermal interface material 200 sandwiched between the cover portion 212 and the semiconductor dies 120 as well as the insulating encapsulation 130 may be substantially uniform in thickness, stress distribution and/or thermal resistance. Accordingly, the thermal interface material 200 is not only conformally attached to the bottom surface of the cover portion 212, but also conformally attached the back surfaces of the semiconductor dies 120a and 120b as well as the top surface of the insulating encapsulation 130. Furthermore, delamination issue of thermal interface material 200 can be effectively solved, and heat dissipation performance of the lid 210 and the thermal interface material 200 are enhanced.

As illustrated in FIG. 5 and FIG. 6, the cover portion 212 of the lid 210 may include a rectangular cover portion having a pair of short sides SS and a pair of long sides LS, portions of the foot segments 214S which are arranged along a pair of short sides SS of the rectangular cover portion 212 are spaced apart from one another by first stiffness adjustment grooves 214G1, and portions of the foot segments 214S which are arranged along a pair of long sides LS of the rectangular cover portion 212 are spaced apart from one another by second stiffness adjustment grooves 214G2. The extending direction of the first stiffness adjustment grooves 214G1 is substantially paralleled with the pair of long sides LS of the rectangular cover portion 212, and the extending direction of the second stiffness adjustment grooves 214G2 is substantially paralleled with the pair of short sides SS of the rectangular cover portion 212. In other words, each one of the first stiffness adjustment grooves 214Ga and the second stiffness adjustment grooves 214G2 extends laterally across the foot portion 214 of the lid 210.

As shown in FIG. 6, a first maximum width W1 of the first stiffness adjustment grooves 214G1 is greater than a second maximum width W2 of the second stiffness adjustment grooves 214G2. The maximum width W1 of the first stiffness adjustment grooves 214G1 may range from about 0.1 millimeter to about 20 millimeters, and the second maximum width W2 of the second stiffness adjustment grooves 214G2 may range from about 0.1 millimeter to about 20 millimeters. The depth of the first stiffness adjustment grooves 214G1 is substantially equal the depth of the second stiffness adjustment grooves 214G2, and the depth of the first stiffness adjustment grooves 214G1 and the second stiffness adjustment grooves 214G2 is equal to the height of the foot segments 214S. The depth of the first stiffness adjustment grooves 214G1 and the second stiffness adjustment grooves 214G2 may range from about 0.2 millimeter to about 3 millimeters. As illustrated in FIG. 5 and FIG. 6, the bottom surface (i.e., inner surface) of the cover portion 212, the bottom surface of the first stiffness adjustment grooves 214G1 and the second stiffness adjustment grooves 214G2 are located at the same level height. The adhesion between the lid 210 and the packaging substrate 110 may be primarily provided by the portions of the foot segments 214S which are arranged along a pair of long sides LS of the rectangular cover portion 212. Compared to the portions of the foot segments 214S which are arranged along a pair of short sides SS of the rectangular cover portion 212, the portions of the foot segments 214S which are arranged along a pair of long sides LS of the rectangular cover portion 212 may provide stronger stiffness.

The lid 210 not only matches with overall profile of the back surfaces of the semiconductor dies 120a and 120b as well as the top surface of the insulating encapsulation 130, but also decreases the warpage the package 100. Accordingly, lifespan and reliability of the semiconductor device including the package 100 and the lid 210 may be enhanced.

Figure 7:
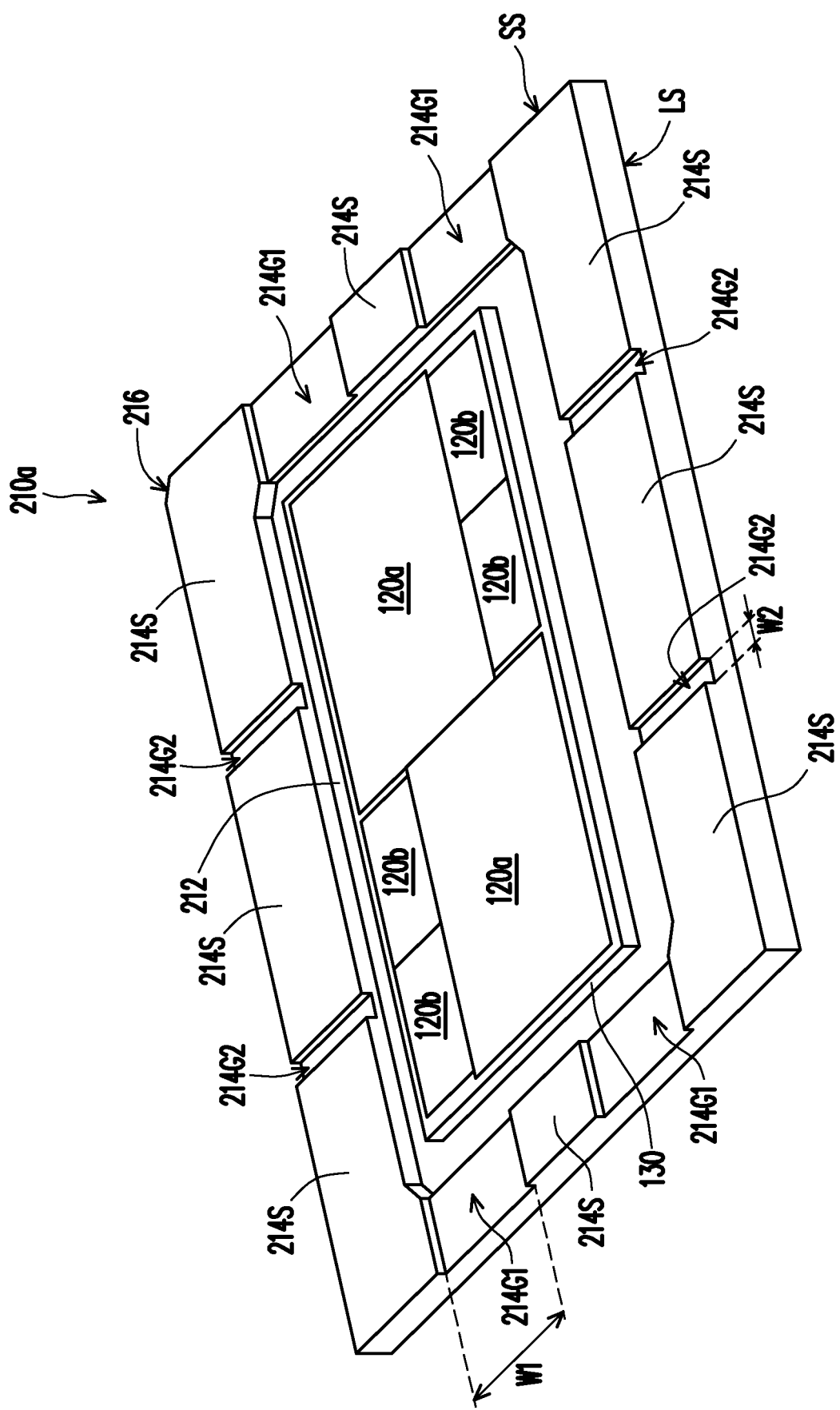
FIG. 7 and FIG. 8 are various three-dimensional views schematically illustrating the package and the lid in accordance with some other embodiments of the present disclosure.

Referring to FIG. 6 and FIG. 7, the lid 210a illustrated in FIG. 7 is similar to the lid 210 illustrated in FIG. 6 except that the depth of the first stiffness adjustment grooves 214G1 is substantially equal the depth of the second stiffness adjustment grooves 214G2, and the depth of the first stiffness adjustment grooves 214G1 and the second stiffness adjustment grooves 214G2 is less than the height of the foot segments 214S. The depth of the first stiffness adjustment grooves 214G1 and the second stiffness adjustment grooves 214G2 may range from about 0.2 millimeter to about 3 millimeters. As illustrated in FIG. 7, the bottom surface of the cover portion 212 is located at a first level height, and the bottom surfaces of the first stiffness adjustment grooves 214G1 and the second stiffness adjustment grooves 214G2 are located at a second level height which are different from the first level height.

Figure 8:
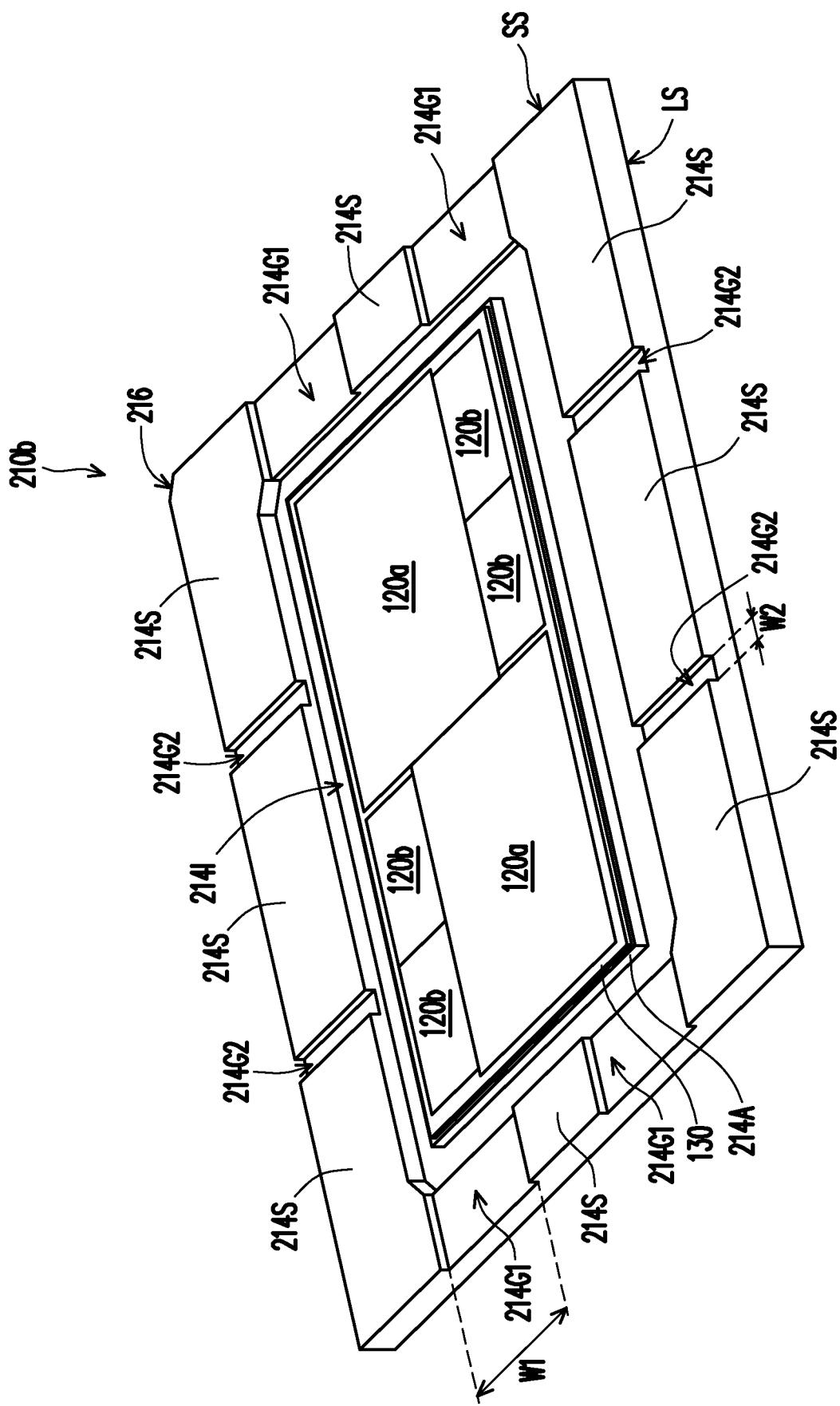

FIG. 8 is a three-dimensional view schematically illustrating the package and the lid in accordance with some other embodiments of the present disclosure.

Referring to FIG. 8, the lid 210b illustrated in FIG. 8 is similar to the lid 210 illustrated in FIG. 6 except that the cover portion 212 the lid 210b further includes a protruding attachment portion 214A, wherein the protruding attachment portion 214A protrudes toward the package 100 (shown in FIG. 3) and is in contact with the thermal interface material 200 (shown in FIG. 3). Furthermore, the cover portion 212 may further include a ring-shaped indentation 214I for defining the attachment portion 214A of the cover portion 214. As illustrated in FIG. 8, the ring-shaped bottom surface of the ring-shaped indentation 214I is located at a first level height, and the bottom surfaces of the first stiffness adjustment grooves 214G1 and the second stiffness adjustment grooves 214G2 are located at a second level height which are different from the first level height. In some embodiments, the attachment surface of the protruding attachment portion 214A, the bottom surfaces of the first stiffness adjustment grooves 214G1 and the bottom surfaces of the second stiffness adjustment grooves 214G2 are located at the same level height.

Figure 9:
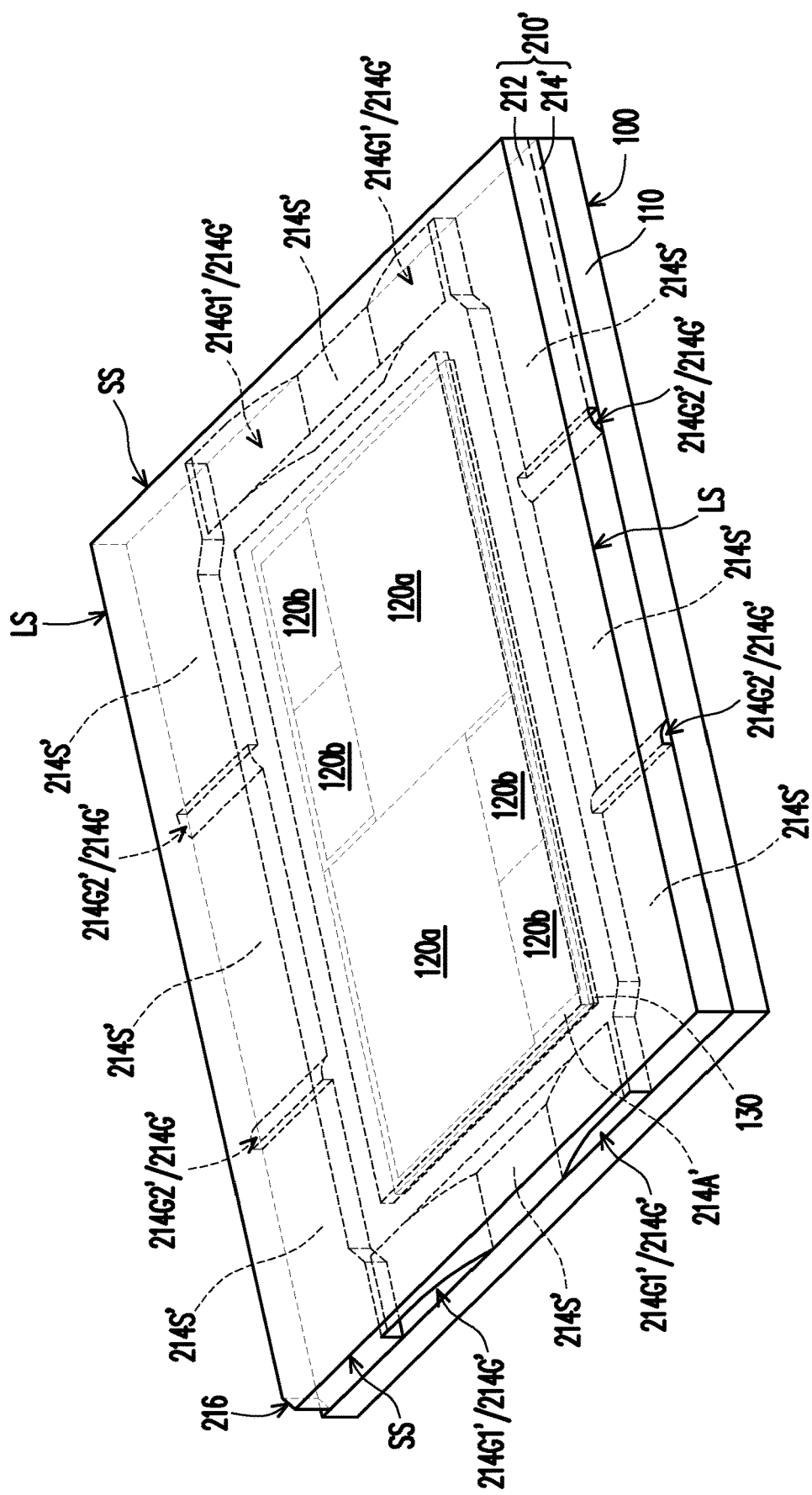
FIG. 9 is a perspective view schematically illustrating a semiconductor device in accordance with some other embodiments of the present disclosure.
Figure 10:
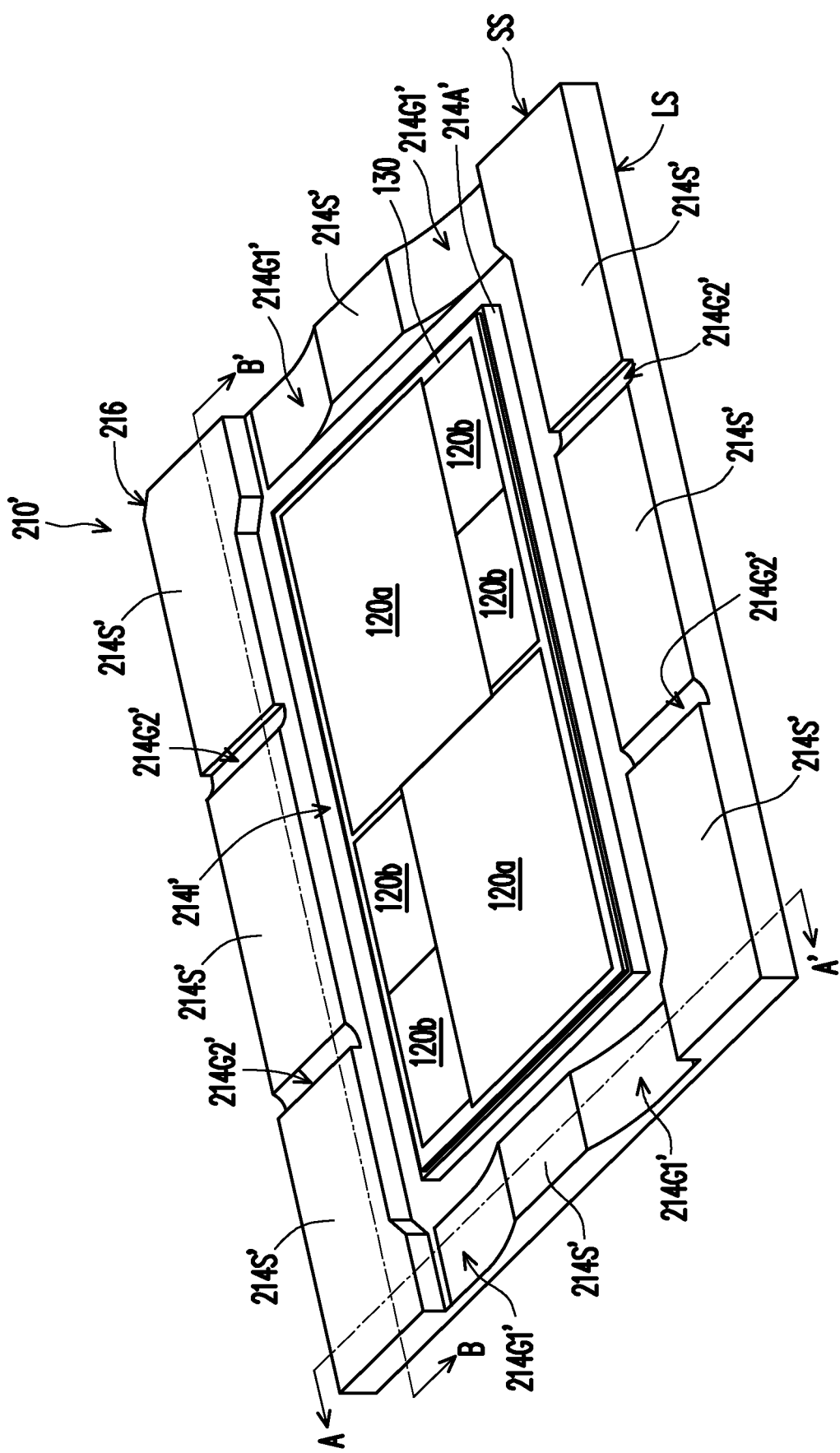
FIG. 10 is a three-dimensional view schematically illustrating the package and the lid shown in FIG. 8 in accordance with some embodiments of the present disclosure.
Figure 11:
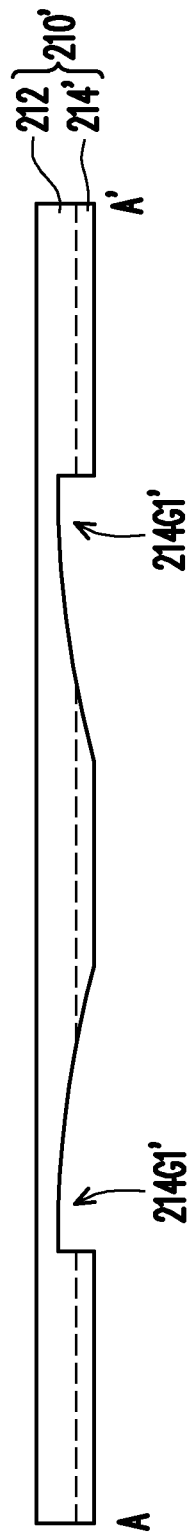
FIG. 11 is a cross-sectional view cut along cross-section line A-A'.
Figure 12:
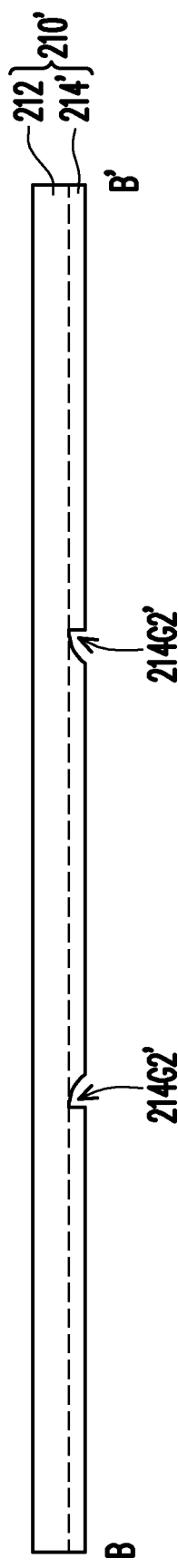
FIG. 12 is a cross-sectional view cut along cross-section line B-B'.

FIG. 9 is a perspective view schematically illustrating a semiconductor device in accordance with some other embodiments of the present disclosure. FIG. 10 is a three-dimensional view schematically illustrating the package and the lid shown in FIG. 8 in accordance with some embodiments of the present disclosure. FIG. 11 is a cross-sectional view cut along cross-section line A-A'. FIG. 12 is a cross-sectional view cut along cross-section line B-B'.

Referring to FIG. 9, the lid 210' includes a cover portion 212 and a foot portion 214' extending from the cover portion 212 to the packaging substrate 110. The cover portion 212 covers the semiconductor dies 120 and the insulating encapsulation 130. The bottom surface of the foot portion 214' is attached to the packaging substrate 110 through the adhesive 190, and the cover portion 212 of the lid 210' is attached to the package 100 through the thermal interface material 200. The details of the lid 210' are described in accompany with FIGS. 9 through 12. The foot portion 214' of the lid 210' includes foot segments 214S' laterally spaced apart from one another, and the bottom surfaces of the foot segments 214S' are attached to the packaging substrate 110 through the adhesive 190 (shown in FIG. 3) to provide sufficient adhesion between the lid 210' and the packaging substrate 110. In some embodiments, the foot portion 214' of the lid 210' includes stiffness adjustment grooves 214G', and the foot segments 214S' are laterally spaced apart from one another by the stiffness adjustment grooves 214G'. In the present embodiments, as illustrated in FIG. 9 and FIG. 10, the stiffness adjustment grooves 214G' are chamfered grooves. The stiffness adjustment grooves 214G' (e.g., the chamfered grooves) are cut-off portions formed in the foot portion 214' of the lid 210'. The stiffness adjustment grooves 214G' (i.e., the cut-off portions) may serve as weakened portions, stiffness control portions or warpage control portions that are formed in the foot portion 214' of the lid 210'. Due to the stiffness adjustment grooves 214G', the cover portion 212 of the lid 210' may deform to substantially match with an overall profile of the back surfaces of the semiconductor dies 120a and 120b as well as the top surface of the insulating encapsulation 130. In some embodiments, an overall profile of the back surfaces of the semiconductor dies 120a and 120b as well as the top surface of the insulating encapsulation 130 is a convex profile because of the warpage of the package 100 (shown in FIG. 3), and the cover portion 212 of the lid 210' attached to the package 100 may deform to substantially match with the above-mentioned convex profile. In some other embodiments, an overall profile of the back surfaces of the semiconductor dies 120a and 120b as well as the top surface of the insulating encapsulation 130 is a concave profile because of the warpage of the package 100 (shown in FIG. 3), and the cover portion 212 of the lid 210' attached to the package 100 may deform to substantially match with the above-mentioned concave profile.

In some other embodiments, the above-mentioned stiffness adjustment grooves may be V-shaped grooves (i.e., grooves having V-shaped cross-sectional profile), U-shaped grooves (i.e., grooves having U-shaped cross-sectional profile) or other suitable types of grooves.

After the lid 210 including the stiffness adjustment grooves 214G' (e.g., the chamfered grooves) is attached onto the package 100 through the adhesive 190 and the thermal interface material 200, the thermal interface material 200 sandwiched between the cover portion 212 and the semiconductor dies 120 as well as the insulating encapsulation 130 may be substantially uniform in thickness, stress and/or thermal resistance. Accordingly, the thermal interface material 200 is not only conformally attached to the bottom surface of the cover portion 212, but also conformally attached the back surfaces of the semiconductor dies 120a and 120b as well as the top surface of the insulating encapsulation 130.

As illustrated in FIG. 9 and FIG. 10, the cover portion 212 of the lid 210' may include a rectangular cover portion having a pair of short sides SS and a pair of long sides LS, portions of the foot segments 214S' which are arranged along a pair of short sides SS of the rectangular cover portion 212 are spaced apart from one another by first stiffness adjustment grooves 214G1', and portions of the foot segments 214S' which are arranged along a pair of long sides LS of the rectangular cover portion 212 are spaced apart from one another by second stiffness adjustment grooves 214G2'. The extending direction of the first stiffness adjustment grooves 214G1' is substantially paralleled with the pair of long sides LS of the rectangular cover portion 212, and the extending direction of the second stiffness adjustment grooves 214G2' is substantially paralleled with the pair of short sides SS of the rectangular cover portion 212. In other words, each one of the first stiffness adjustment grooves 214Ga and the second stiffness adjustment grooves 214G2' extends laterally across the foot portion 214' of the lid 210'.

As shown in FIG. 10 through FIG. 12, a first maximum width W1 of the first stiffness adjustment grooves 214G1' is greater than a second maximum width W2 of the second stiffness adjustment grooves 214G2'. The maximum width W1 of the first stiffness adjustment grooves 214G1' may range from about 2 millimeters to about 30 millimeters, and the second maximum width W2 of the second stiffness adjustment grooves 214G2' may range from about 2 millimeters to about 30 millimeters. The maximum depth of the first stiffness adjustment grooves 214G1' is greater than the maximum depth of the second stiffness adjustment grooves 214G2', the maximum depth of the first stiffness adjustment grooves 214G1' is greater than the height of the foot segments 214S', and maximum depth of the second stiffness adjustment grooves 214G2' is substantially equal to the height of the foot segments 214S'. The first stiffness adjustment grooves 214G1' are not only distributed in the foot portion 214' of the lid 210', but also extend into the cover portion 212 of the lid 210'. The maximum depth of the first stiffness adjustment grooves 214G1' may range from about 0.2 millimeter to about 3 millimeters, and the maximum depth of the second stiffness adjustment grooves 214G2' may range from about 0.2 millimeter to about 3 millimeters. As illustrated in FIG. 9 and FIG. 10, the adhesion between the lid 210' and the packaging substrate 110 may be primarily provided by the portions of the foot segments 214S' which are arranged along a pair of long sides LS of the rectangular cover portion 212. Compared to the portions of the foot segments 214S' which are arranged along a pair of short sides SS of the rectangular cover portion 212, the portions of the foot segments 214S' which are arranged along a pair of long sides LS of the rectangular cover portion 212 may provide stronger stiffness.

In some embodiments, the cover portion 212 the lid 210' may further includes a protruding attachment portion 214A', wherein the protruding attachment portion 214A' protrudes toward the package 100 (shown in FIG. 3) and is in contact with the thermal interface material 200 (shown in FIG. 3). Furthermore, the cover portion 212 may further include a ring-shaped indentation 2141' for defining the attachment portion 214A' of the cover portion 214'. In some other embodiments, the protruding attachment portion 214A' and the ring-shaped indentation 2141' formed in the cover portion 212 the lid 210' are omitted.

The lid 210' not only matches with overall profile of the back surfaces of the semiconductor dies 120a and 120b as well as the top surface of the insulating encapsulation 130, but also decreases the warpage the package 100. Accordingly, lifespan and reliability of the semiconductor device including the package 100 and the lid 210' may be enhanced.

Figure 13:
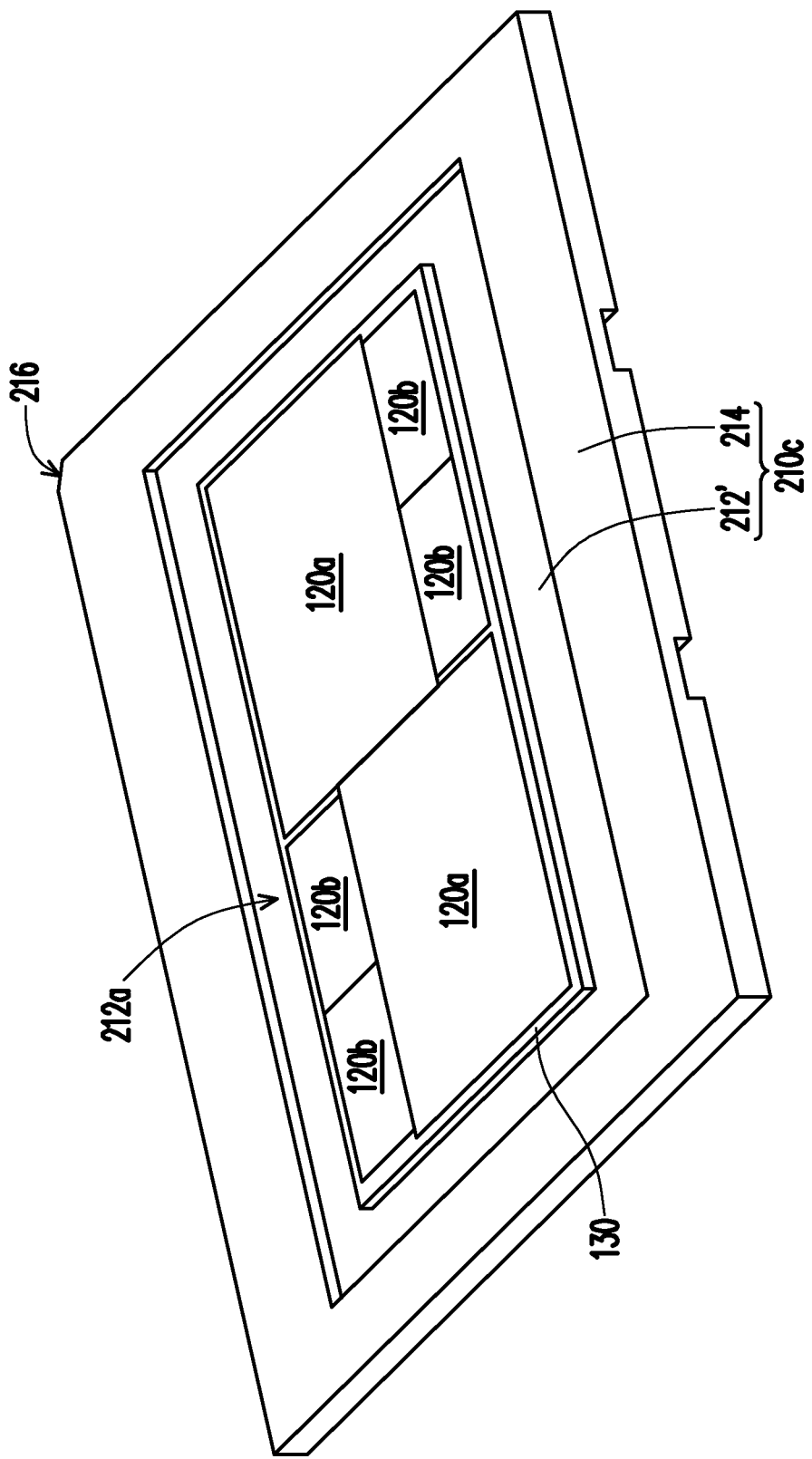
FIG. 13 and FIG. 14 are three-dimensional views schematically illustrating the package and the lid in accordance with some alternative embodiments of the present disclosure.
Figure 14:
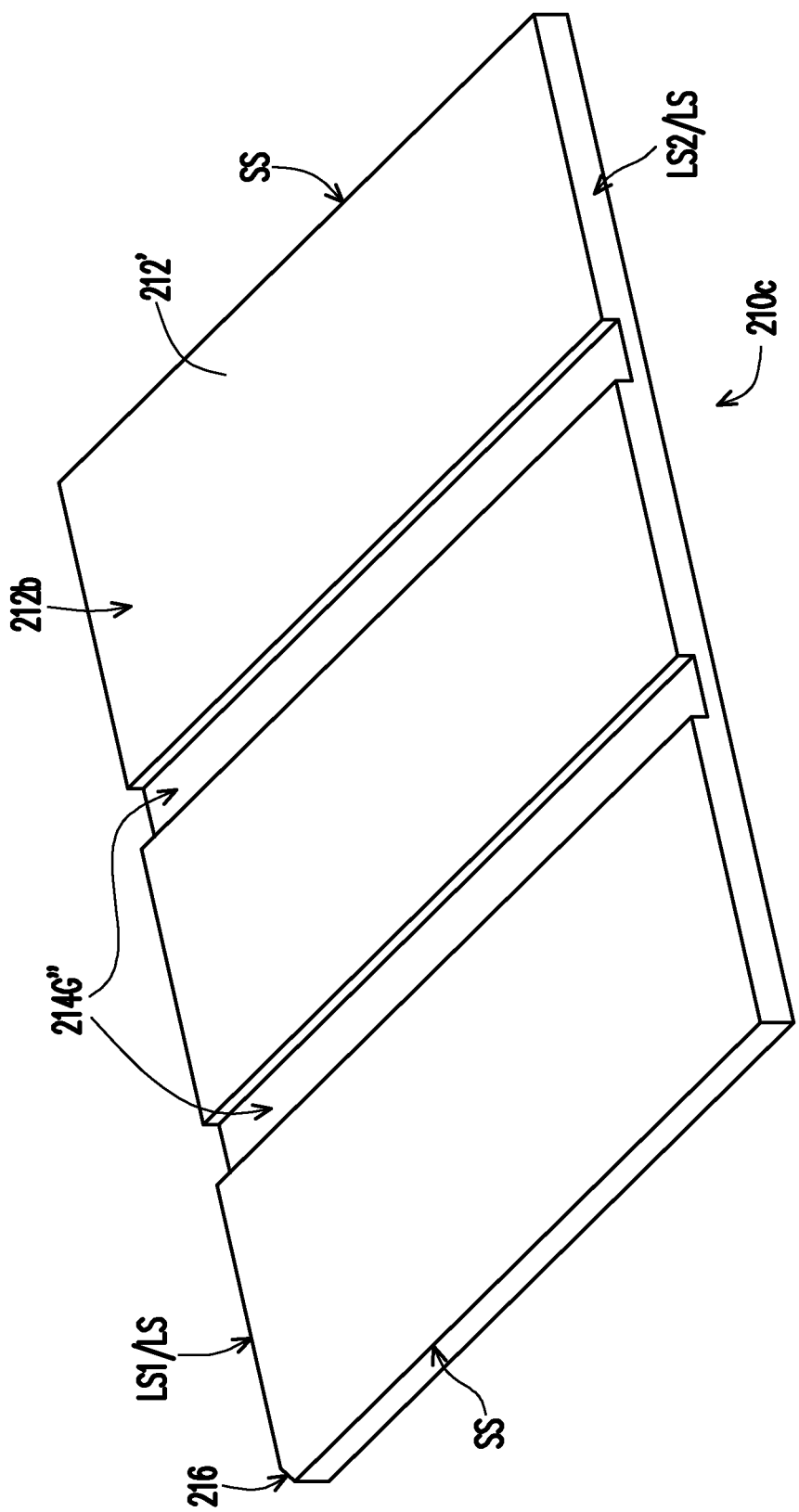

FIG. 13 and FIG. 14 are three-dimensional views schematically illustrating the package and the lid in accordance with some alternative embodiments of the present disclosure.

Referring to FIG. 2 and FIG. 13, in accordance with some alternative embodiments of the present disclosure, a lid 210c is provided and applied to assemble with the package 100 illustrated in FIG. 2. The lid 210c includes a cover portion 212' and foot portion 214 extending from the cover portion 212' to the packaging substrate 110 (shown in FIG. 2), wherein the cover portion 212' includes an inner surface 212a, an outer surface 212b opposite to the inner surface 212a, and stiffness adjustment grooves 214G" distributed on the outer surface 212b of the cover portion 212'. The thermal interface material 200 (shown in FIG. 2) is adhered with the inner surface 212a of the cover portion 212' of the lid 210c and the package 100. In some embodiments, the cover portion 212' includes a rectangular cover portion having a pair of short sides SS and a pair of long sides LS, and an extending direction of the stiffness adjustment grooves 214G" are substantially paralleled with the pair of short sides SS of the rectangular cover portion 212'. In some embodiments, the stiffness adjustment grooves 214G" extend from a first long side LS1 among the pair of long sides LS to a second long side LS2 among the pair of long sides LS.

It is noted that design of the stiffness adjustment grooves 214G" illustrated in FIG. 14 may be combined with the lid 210 illustrated in FIG. 6, the lid 210a illustrated in FIG. 7, the lid 210b illustrated in FIG. 8 or the lid 210' illustrated in FIG. 10. In other words, the stiffness adjustment grooves 214G" illustrated in FIG. 14 may be formed on an outer surface of the lid 210 illustrated in FIG. 6, the lid 210a illustrated in FIG. 7, the lid 210b illustrated in FIG. 8 or the lid 210' illustrated in FIG. 10.

In accordance with some embodiments of the disclosure, a semiconductor device including a package, a lid and a thermal interface material is provided. The package includes a packaging substrate, semiconductor dies and an insulating encapsulation, wherein the semiconductor dies are disposed on and electrically connected to the packaging substrate, and the insulating encapsulation encapsulates the semiconductor dies. The lid is disposed on the packaging substrate, the lid includes a cover portion and foot portion extending from the cover portion to the packaging substrate, wherein the cover portion covers the semiconductor dies and the insulating encapsulation, the foot portion includes foot segments laterally spaced apart from one another, and the foot segments are attached to the packaging substrate. The cover portion of the lid is attached to the package through the thermal interface material. In some embodiments, the package further includes an interposer disposed between the packaging substrate and the semiconductor dies encapsulated by the insulating encapsulation, and the semiconductor dies are electrically connected to the packaging substrate through the interposer. In some embodiments, the package includes an integrated fanout structure assembled on packaging substrate. In some embodiments, the foot portion of the lid includes grooves, and the foot segments are laterally spaced apart from one another by the grooves. In some embodiments, the cover portion includes a rectangular cover portion, the foot segments arranged along a pair of short sides of the rectangular cover portion are spaced apart from one another by first grooves, and the foot segments arranged along a pair of long sides of the rectangular cover portion are spaced apart from one another by second grooves. In some embodiments, a first extending direction of the first grooves is substantially paralleled with the pair of long sides of the rectangular cover portion, a second extending direction of the second grooves is substantially paralleled with the pair of short sides of the rectangular cover portion, and a first maximum width of the first grooves is greater than a second maximum width of the second grooves. In some embodiments, a first depth of the first grooves is substantially equal to or greater than a second depth of the second grooves. In some embodiments, the cover portion further includes a ring-shaped indentation defining an attachment portion of the cover portion, and the attachment portion is in contact with the thermal interface material. In some embodiments, the cover portion further includes a protruding attachment portion, and the protruding attachment portion protrudes toward the package and is in contact with the thermal interface material.

In accordance with some other embodiments of the disclosure, a semiconductor device including a package, a lid and a thermal interface material is provided. The package includes a packaging substrate, semiconductor dies and an insulating encapsulation, wherein the semiconductor dies are disposed on and electrically connected to the packaging substrate, and the insulating encapsulation encapsulates the semiconductor dies. The lid is disposed on the packaging substrate, the lid includes a cover portion, a foot portion and stiffness adjustment grooves, wherein the foot portion extends from the cover portion to the package, and the stiffness adjustment grooves laterally extend across the foot portion. The cover portion of the lid is attached to the package through the thermal interface material. In some embodiments, the package further includes an interposer disposed between the packaging substrate and the semiconductor dies encapsulated by the insulating encapsulation, and the semiconductor dies are electrically connected to the packaging substrate through the interposer. In some embodiments, the package includes an integrated fanout structure assembled on packaging substrate. In some embodiments, the cover portion includes a rectangular cover portion, first stiffness adjustment grooves among the stiffness adjustment grooves are arranged along a pair of short sides of the rectangular cover portion, and second stiffness adjustment grooves among the stiffness adjustment grooves are arranged along a pair of long sides of the rectangular cover portion. In some embodiments, a first extending direction of the first stiffness adjustment grooves is substantially paralleled with the pair of long sides of the rectangular cover portion, a second extending direction of the second stiffness adjustment grooves is substantially paralleled with the pair of short sides of the rectangular cover portion, and a first maximum width of the first stiffness adjustment grooves is greater than a second maximum width of the second stiffness adjustment grooves. In some embodiments, a first depth of the first stiffness adjustment grooves is substantially equal to or greater than a second depth of the second stiffness adjustment grooves. In some embodiments, the cover portion further includes a ring-shaped indentation defining an attachment portion of the cover portion, and the attachment portion is in contact with the thermal interface material. In some embodiments, the cover portion further includes a protruding attachment portion, and the protruding attachment portion protrudes toward the package and is in contact with the thermal interface material.

In accordance with some other embodiments of the disclosure, a semiconductor device including a package, a lid and a thermal interface material is provided. The package includes a packaging substrate, semiconductor dies and an insulating encapsulation, wherein the semiconductor dies are disposed on and electrically connected to the packaging substrate, and the insulating encapsulation encapsulates the semiconductor dies. The lid is disposed on the packaging substrate, the lid includes a cover portion and foot portion extending from the cover portion to the package, wherein the cover portion includes an inner surface, an outer surface opposite to the inner surface, and stiffness adjustment grooves distributed on the outer surface. The thermal interface material is adhered with the inner surface of the cover portion of the lid and the package. In some embodiments, the cover portion includes a rectangular cover portion having a pair of short sides and a pair of long sides, and an extending direction of the stiffness adjustment grooves are substantially paralleled with the pair of short sides of the rectangular cover portion. In some embodiments, the stiffness adjustment grooves extend from a first long side among the pair of long sides to a second long side among the pair of long sides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a package comprising a packaging substrate, semiconductor dies and an insulating encapsulation, wherein the semiconductor dies are disposed on and electrically connected to the packaging substrate, and the insulating encapsulation encapsulates the semiconductor dies;
   a lid disposed on the packaging substrate, the lid comprising a rectangular cover portion and foot portion extending from the rectangular cover portion to the packaging substrate, wherein the rectangular cover portion covers the semiconductor dies and the insulating encapsulation, the foot portion comprises foot segments laterally spaced apart from one another, and the foot segments are attached to the packaging substrate, and wherein the foot segments comprise first foot segments arranged along a pair of short sides of the rectangular cover portion and second foot segments arranged along a pair of long sides of the rectangular cover portion, the first foot segments provide a first stiffness, and the second foot segments provide a second stiffness greater than the first stiffness; and
   a thermal interface material, wherein the rectangular cover portion of the lid is attached to the package through the thermal interface material.

2. The semiconductor device of claim 1, wherein the package further comprises an interposer disposed between the packaging substrate and the semiconductor dies encapsulated by the insulating encapsulation, and the semiconductor dies are electrically connected to the packaging substrate through the interposer.

3. The semiconductor device of claim 1, wherein the package comprises an integrated fanout structure assembled on packaging substrate.

4. The semiconductor device of claim 1, wherein the foot portion of the lid comprises grooves, and the foot segments are laterally spaced apart from one another by the grooves.

5. The semiconductor device of claim 1, wherein the first foot segments are spaced apart from one another by first grooves, and the second foot segments are spaced apart from one another by second grooves.

6. The semiconductor device of claim 5, wherein a first extending direction of the first grooves is substantially paralleled with the pair of long sides of the rectangular cover portion, a second extending direction of the second grooves is substantially paralleled with the pair of short sides of the rectangular cover portion, and a first maximum width of the first grooves is greater than a second maximum width of the second grooves.

7. The semiconductor device of claim 5, wherein a first depth of the first grooves is substantially equal to or greater than a second depth of the second grooves.

8. The semiconductor device of claim 1, wherein the rectangular cover portion further comprises a ring-shaped indentation defining an attachment portion of the rectangular cover portion, and the attachment portion is in contact with the thermal interface material.

9. The semiconductor device of claim 1, wherein the rectangular cover portion further comprises a protruding attachment portion, and the protruding attachment portion protrudes toward the package and is in contact with the thermal interface material.

10. A semiconductor device, comprising:
a package comprising a packaging substrate, semiconductor dies and an insulating encapsulation, wherein the semiconductor dies are disposed on and electrically connected to the packaging substrate, and the insulating encapsulation encapsulates the semiconductor dies;
a lid disposed on the packaging substrate, the lid comprising a rectangular cover portion, a foot portion and stiffness adjustment grooves, wherein the foot portion extends from the cover portion to the package, and the stiffness adjustment grooves laterally extend across the foot portion, and wherein a first area occupied by first foot segments among the foot segments arranged along a pair of short sides of the rectangular cover portion is less than a second area occupied by second foot segments among the foot segments arranged along a pair of long sides of the rectangular cover portion; and
a thermal interface material, wherein the rectangular cover portion of the lid is attached to the package through the thermal interface material.

11. The semiconductor device of claim 10, wherein the package further comprises an interposer disposed between the packaging substrate and the semiconductor dies encapsulated by the insulating encapsulation, and the semiconductor dies are electrically connected to the packaging substrate through the interposer.

12. The semiconductor device of claim 10, wherein the package comprises an integrated fanout structure assembled on packaging substrate.

13. The semiconductor device of claim 10, wherein first stiffness adjustment grooves among the stiffness adjustment grooves are arranged along the pair of short sides of the rectangular cover portion, and second stiffness adjustment grooves among the stiffness adjustment grooves are arranged along the pair of long sides of the rectangular cover portion.

14. The semiconductor device of claim 13, wherein a first extending direction of the first stiffness adjustment grooves is substantially paralleled with the pair of long sides of the rectangular cover portion, a second extending direction of the second stiffness adjustment grooves is substantially paralleled with the pair of short sides of the rectangular cover portion, and a first maximum width of the first stiffness adjustment grooves is greater than a second maximum width of the second stiffness adjustment grooves.

15. The semiconductor device of claim 13, wherein a first depth of the first stiffness adjustment grooves is substantially equal to or greater than a second depth of the second stiffness adjustment grooves.

16. The semiconductor device of claim 10, wherein the rectangular cover portion further comprises a ring-shaped indentation defining an attachment portion of the rectangular cover portion, and the attachment portion is in contact with the thermal interface material.

17. The semiconductor device of claim 10, wherein the rectangular cover portion further comprises a protruding attachment portion, and the protruding attachment portion protrudes toward the package and is in contact with the thermal interface material.

18. A semiconductor device, comprising:
a package comprising a packaging substrate, semiconductor dies and an insulating encapsulation, wherein the semiconductor dies are disposed on and electrically connected to the packaging substrate, and the insulating encapsulation encapsulates the semiconductor dies;
a lid disposed on the packaging substrate, the lid comprising a cover portion and foot portion extending from the cover portion to the package, wherein the cover portion comprises an inner surface, an outer surface opposite to the inner surface, and stiffness adjustment grooves distributed on the outer surface, wherein the inner surface is between the package and the outer surface; and
a thermal interface material adhered with the inner surface of the cover portion of the lid and the package.

19. The semiconductor device of claim 18, wherein the cover portion comprises a rectangular cover portion having a pair of short sides and a pair of long sides, and an extending direction of the stiffness adjustment grooves are substantially paralleled with the pair of short sides of the rectangular cover portion.

20. The semiconductor device of claim 19, wherein the stiffness adjustment grooves extend from a first long side among the pair of long sides to a second long side among the pair of long sides.

* * * * *